United States Patent
Hui et al.

(10) Patent No.: US 6,809,033 B1
(45) Date of Patent: Oct. 26, 2004

(54) INNOVATIVE METHOD OF HARD MASK REMOVAL

(75) Inventors: Angela Hui, Fremont, CA (US); Jusuke Ogura, Cupertino, CA (US)

(73) Assignee: FASL, LLC, Sunnyvale, CA (US)

( * ) Notice: Subject to any disclaimer, the term of this patent is extended or adjusted under 35 U.S.C. 154(b) by 0 days.

(21) Appl. No.: 10/045,354

(22) Filed: Nov. 7, 2001

(51) Int. Cl.[7] .................................... H01L 21/311
(52) U.S. Cl. ................ 438/694; 438/695; 438/697; 438/709; 438/717; 438/738
(58) Field of Search ................ 438/694, 695, 438/697, 709, 717, 738, 9

(56) References Cited

U.S. PATENT DOCUMENTS

| | | | |
|---|---|---|---|
| 5,270,265 A * | 12/1993 | Hemmenway et al. ...... | 438/404 |
| 5,789,320 A | 8/1998 | Andricacos et al. | |
| 5,998,278 A * | 12/1999 | Yu .............................. | 438/424 |
| 6,010,949 A | 1/2000 | Li et al. | |
| 6,015,757 A * | 1/2000 | Tsai et al. ................... | 438/697 |
| 6,057,224 A * | 5/2000 | Bothra et al. ............... | 438/619 |
| 6,103,455 A * | 8/2000 | Huang et al. ............... | 430/313 |
| 6,159,821 A * | 12/2000 | Cheng et al. ............... | 438/424 |
| 6,159,844 A * | 12/2000 | Bothra ........................ | 438/637 |
| 6,261,967 B1 | 7/2001 | Athavale et al. | |
| 6,313,043 B1 * | 11/2001 | Hattori ........................ | 438/745 |
| 6,376,303 B1 * | 4/2002 | Seo et al. ................... | 438/253 |
| 6,440,640 B1 * | 8/2002 | Yang et al. ................. | 430/314 |
| 6,541,312 B2 | 4/2003 | Cleeves et al. | |
| 6,548,408 B1 * | 4/2003 | Morgan ...................... | 438/692 |
| 6,646,314 B2 * | 11/2003 | Rudhard ..................... | 257/415 |
| 6,743,728 B2 * | 6/2004 | Ho et al. ..................... | 438/700 |
| 2001/0001723 A1 * | 5/2001 | Gardner et al. ............. | 438/305 |
| 2002/0004281 A1 * | 1/2002 | Lee et al. ................... | 438/424 |
| 2002/0117706 A1 * | 8/2002 | Shimizu | |
| 2002/0125521 A1 * | 9/2002 | Schrems ..................... | 257/301 |
| 2002/0158283 A1 * | 10/2002 | Chung | |
| 2002/0163026 A1 * | 11/2002 | Park ........................... | 257/301 |
| 2002/0168834 A1 * | 11/2002 | Chen et al. ................. | 438/427 |
| 2004/0058549 A1 * | 3/2004 | Ho et al. ..................... | 438/694 |

* cited by examiner

Primary Examiner—W. David Coleman
Assistant Examiner—Khiem Nguyen
(74) Attorney, Agent, or Firm—Eschweiler & Associates, LLC

(57) ABSTRACT

One aspect of the invention relates to a method of removing a hard mask from a surface, especially a silicon surface. The hard mask is removed by first applying a sacrificial coating and then plasma etching. The sacrificial material fills pattern gaps formed using the hard mask and protects insulators, such as oxides, within those pattern gaps. The sacrificial material is removed together with the hard mask by the plasma etching. The invention provides a process for removing hard masks from silicon layers without significantly damaging either the silicon layer or any exposed oxides and can be applied in a variety of integrated circuit device manufacturing processes, such as patterning the floating gate layer of a flash memory device.

23 Claims, 2 Drawing Sheets

US 6,809,033 B1

INNOVATIVE METHOD OF HARD MASK REMOVAL

TECHNICAL FIELD OF THE INVENTION

The present invention relates generally to semiconductor device manufacturing and more particularly to methods of removing hard masks.

BACKGROUND OF THE INVENTION

In the semiconductor industry, there is a continuing trend toward high device densities. To achieve these high device densities, small features on semiconductor wafers are required. These may include the width and spacing of interconnecting lines, spacing and diameter of contact holes, and spacing and width of doped regions of a substrate, such as regions that form buried bit lines in a memory array.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the silicon wafer, forming a patterned resist. The pattern of the resist corresponds to the image, or negative image, of the reticle.

The resist pattern is generally used as a mask for an etch process wherein the resist pattern is transferred to an underlying layer. In some cases, the resist is not sufficiently durable to survive the conditions required to etch the layer in which the pattern is desired. In such cases, the resist pattern is first transferred to an intermediate layer, which is referred to as a hard mask. The hard mask is etched using the resist as a pattern. The resist is then stripped and another etch process is used to transfer the pattern to a layer beneath the hard mask. Finally, the hard mask is stripped.

For example, polysilicon layers are generally patterned using a hard mask. The hard mask is typically silicon nitride (SiN) or silicon oxynitride (SiON) and can function as a bottom anti-reflective coating (BARC) that facilitates the lithographic process. The resist is formed over the hard mask and lithographically patterned. The pattern is transferred from the resist to the hard mask by plasma etching, using $CF_4$, for example. After stripping the resist, the pattern is transferred from the hard mask to the polysilicon by etching with $Cl_2$ and HBr. The hard mask is then removed, typicaily with phosphoric acid.

A difficulty with the forgoing process is that the hard mask strip with phosphoric acid has a tendency to damage the polysilicon layer. Removal of the hardmask by plasma etching has also been considered, but plasma etching tends to gauge oxide layers where they are exposed within the pattern gaps of the polysilicon layer. There is an unsatisfied need for methods of removing hard masks while minimizing damage to polysilicon and oxide structures.

SUMMARY OF THE INVENTION

The following presents a simplified summary of the invention in order to provide a basic understanding of some of its aspects. This sun unary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to a method of removing a hard mask from a surface, especially a silicon surface. The hard mask is removed by first applying a sacrificial coating and then plasma etching. The sacrificial material fills pattern gaps formed using the hard mask and protects insulators, such as oxides, within those pattern gaps. The sacrificial material is removed together with the hard mask by the plasma etching. The invention provides a process for removing hard masks from silicon layers without significantly damaging either the silicon or any exposed oxides and can be applied in a variety of integrated circuit device manufacturing processes, such as patterning the floating gate layer of a flash memory device.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

Figure 1:
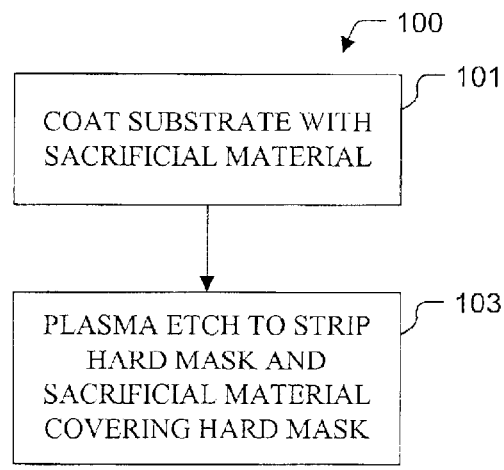
FIG. 1 is a flow chart of a process according to one aspect of the present invention.

The present invention will now be described with reference to the drawings. FIG. 1 is a flow chart of a process 100 for stripping a hard mask according to one aspect of the present invention. Process 100 is applicable to a variety of integrated circuit device manufacturing processes. For example, in the formation of floating gate flash memory devices it is common to form field oxide islands on a silicon wafer, form a thin gate oxide layer over the wafer, coat the wafer with polysilicon, and then pattern the polysilicon. The polysilicon is patterned subsequently using a hard mask and the process 100 can be employed to strip the hard mask without unduly damaging either the polysilicon or the field oxide, which is exposed in places by gaps patterned into the polysilicon.

Process 100 includes action 101, coating the substrate, including a hard mask, with a sacrificial material, and action 103, plasma etching to remove the hard mask and at least that portion of the sacrificial material that covers the hard mask. The sacrificial material etches at a rate that is comparable to the etch rate for the hard mask, whereby the sacrificial material substantially protects material within the gaps as the hard mask is being stripped.

The substrate generally comprises a semiconductor, which is typically silicon. Examples of other semiconductors include GaAs and InP. In addition to a semiconducting material, the substrate may include various elements therein and/or layers thereon. These can include metal layers, barrier layers, dielectric layers, device structures, active elements and passive elements including silicon gates, word lines, source regions, drain regions, bit lines, bases emitters, collectors, conductive lines, conductive vias, etc.

The hard mask is formed over a layer or bulk portion of the substrate that is to be patterned. Generally, the layer or bulk portion of the substrate contains silicon. The silicon can be single crystal silicon, amorphous silicon, or polysilicon. The silicon can be doped n-type or p-type or un-doped. An underlying insulating material is exposed within gaps in the hard mask (after the hard mask has been patterned) where the underlying layer has either been etched into or through. In one embodiment, the insulating material is exposed by etching through a silicon-containing layer using the hard mask. In another embodiment, the insulating material is provided in trenches etched into a silicon-containing layer or bulk portion of the substrate using the hard mask.

The pattern gaps can be of any suitable size or shape. In one embodiment, the pattern includes gaps having widths within the range from about from 0.1 to about 100 $\mu$m. In another embodiment, the pattern includes gaps having widths within the range from about from 0.18 to about 10 $\mu$m. In a further embodiment, the pattern includes gaps having widths within the range from about from 0.25 to about 1 $\mu$m.

Generally, the insulating material is an oxide. The oxide can be silicon oxide or TEOS or high density plasma oxide (HDP). The oxide can be formed, for example, by oxidizing a silicon substrate or by CVD. The oxide is usually of a type that is susceptible to gouging under plasma etching conditions that would be effective for removing the hard mask.

The hard mask has a composition and thickness suitable for its function of masking the underlying layer during a pattern transfer process. In one embodiment, the hard mask is from about 100 to about 10,000 Angstroms thick. In another embodiment, the hard mask is from about 200 to about 2,500 Angstroms thick. In a further embodiment, the hard mask is from about 300 to about 1,000 Angstroms thick. Examples of hard mask materials are compositions that include nitrides and compositions that include silicon carbide (SiC). Examples of nitrides include silicon nitride (SiN), which can be silicon rich or nitrogen rich, silicon oxynitride (SiON), which can be silicon rich, oxygen rich, or nitrogen rich, titanium nitride (TiN), and titanium oxynitride (TiON). The hard mask can be deposited by any suitable method, including, for example, sputter deposition.

Action 101 of FIG. 1 is coating the substrate with a sacrificial material. The sacrificial material covers the patterned hard mask and fills the pattern gaps. The sacrificial material can be applied by any suitable method: spin-coating, for example. In one embodiment, the sacrificial material is from about 100 to about 10,000 Angstroms thick. In another embodiment, the sacrificial material is from about 200 to about 2,500 Angstroms thick. In a further embodiment, the sacrificial material is from about 300 to about 1,000 Angstroms thick.

The sacrificial material is selected to etch at a similar rate to the hard mask. In one embodiment, the ratio of the sacrificial material etch rate to that of the hard mask under the conditions used to remove the hard mask is from about 2:1 to about 1:3. In another embodiment, the ratio is from about 1.5:1 to about 1:2. In a further embodiment, the ratio is from about 1:1 to about 1:1.5.

Examples of suitable sacrificial materials include photoresists and organic bottom anti-reflective coating (BARC) materials. Examples of photoresists include novalacs, poly-t-butoxycarbonyloxystyrenes (PBOCOS), poly-methylmethacrylates (PMMA), poly(olephin sulfones) (POS), and poly(m ethyl isophenyl ketones) (PMIPK). Examples of organic BARC materials include polyimides, polysulfones, and propylene glycol monomethyl ether. The sacrificial material can also be an inorganic BARC material and can be the same material, or type of material, used to form the hard mask. It is, however, advantageous if the sacrificial material can be spin-coated on the substrate. It is also advantageous if the sacrificial material can be easily cleaned from the substrate. Generally, photoresists and organic BARC materials can be spin-coated on the substrate and easily cleaned. A spin-coated sacrificial material is generally baked after deposition, typically at a temperature from about 110 to about 140° C., whereby the surface is planarized.

The hard mask and the sacrificial material overlying the patterned hard mask are removed over the course of action 103, which is plasma etching. Generally, all of the sacrificial material is removed by plasma etching, although it is possible to remove sacrificial material remaining in the pattern gaps after stripping the hard mask by another operation.

Any suitable chemistry can be employed for plasma etching the sacrificial material and the hard mask. Typically, a fluorine chemistry is used, for example, $CHF_3/O_2$ or $CH_3F/O_2$. In one embodiment, the chemistry provides a selectivity for the hard mask material as compared to an underlying silicon material of at least about 5:1. In another embodiment, the selectivity is at least about 10:1. In a further embodiment, the selectivity is at least about 15:1.

Figure 2:
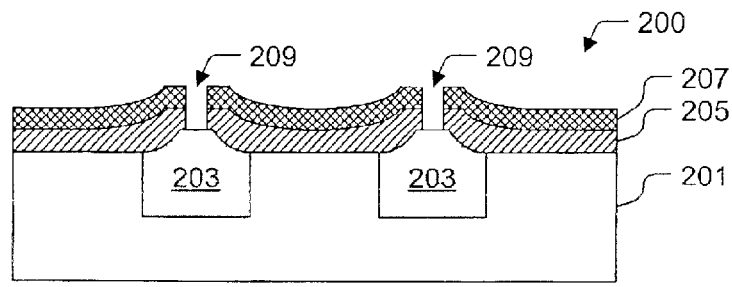
FIG. 2 is a schematic illustration of a substrate to which a process of the invention can be applied.

FIGS. 2–6 provide an example of a process according to the present invention. FIG. 2 is a schematic illustration of a substrate 200 at the beginning of the process. The substrate 200 includes a silicon wafer 201, field oxide islands 203, a polysilicon layer 205, and a hard mask 207. Gaps 209 have been patterned through the polysilicon layer 205 using the hard mask 207. The field oxide islands 203 are partially exposed within the gaps 209.

Figure 3:
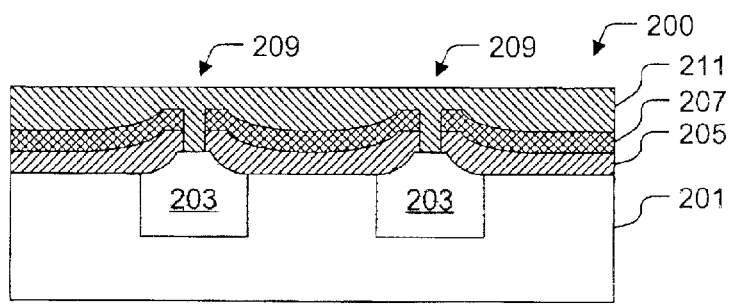
FIG. 3 is a schematic illustration of the substrate of FIG. 2 after coating with a sacrificial material.

FIG. 3 illustrates the substrate 200 after coating with a sacrificial material 211, as in action 101. The sacrificial material 211 fills the gaps 209 and covers the hard mask 207. As a result of spin-coating and baking, the sacrificial material 211 has a relatively level top surface.

Figure 4:
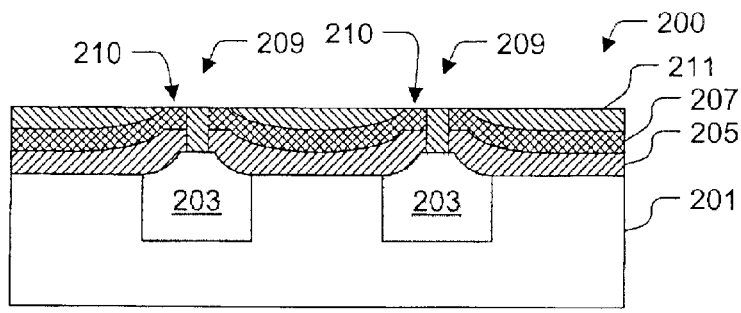
FIG. 4 is a schematic illustration of the substrate of FIG. 3 after plasma etching has exposed a portion of the hard mask.

FIG. 4 illustrates the substrate 200 after the start of plasma etching, as in action 103. At the point illustrated in FIG. 4, plasma etching has entirely removed a portion of the sacrificial material 211 and exposed the hard mask 207 in places illustrated generally at reference numeral 210. The top surface of the substrate 200 is still planar at this point in the plasma etching process, but can subsequently develop slight variations due to differences between the etch rate for the sacrificial material 211 and the hard mask 207.

Figure 5:
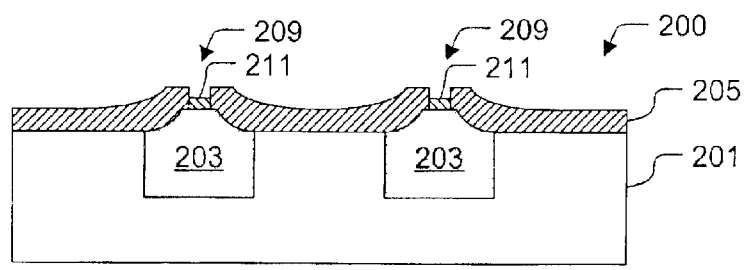
FIG. 5 is a schematic illustration of the substrate of FIG. 4 after plasma etching has removed the hard mask.

FIG. 5 illustrates the substrate 200 after plasma etching has progressed to the point where the hard mask 207 has been removed entirely. Some of the sacrificial material 211 still remains in the gaps 209. The depth of the sacrificial material in the gaps 209 at the point where the hard mask 207 is removed entirely depends on the relative etch rates of the sacrificial material 211 and the hard mask 207. The remaining sacrificial material can be left in the gaps 209 or can be stripped with a solvent, however, it is more common to continue plasma etching until all of the sacrificial material has been removed.

Figure 6:
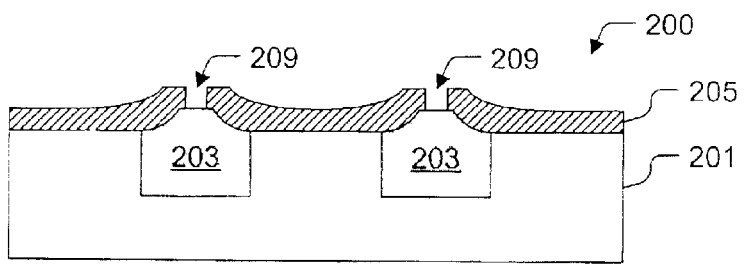
FIG. 6 is a schematic illustration of the substrate of FIG. 5 area plasma etching has removed the sacrificial material.

FIG. 6 illustrates the substrate 200 after plasma etching has removed entirely the sacrificial material 211 in addition to the hard mask 207. Some gouging of the field oxide islands 203 can occur during plasma etching, but this gouging can be kept to a minimum by timing the plasma etching process or monitoring the progress of the plasma etching process. The extent of gouging can be kept to less than about 10% of the extent of gouging that would occur if the hard mask were removed by plasma etching without the use of the sacrificial material 211.

Note that in one prior art hard mask removal methodology, a wet etch solution is used to remove the hard mask, and although the wet etch is relatively gentle to an exposed oxide material (e.g., in the hard mask gaps), the wet etchant causes substantial damage to the underlying silicon layer (e.g. polysilicon) once the hard mask is removed. Further, in another prior art hard mask removal method, use of a dry etch directly on the hard mask with the oxide exposed results in a substantial amount of damage to the oxide (e.g., gouging), since the oxide is exposed to the dry etch during the entire removal phase of the hard mask.

In stark contrast to the prior art hard mask removal methods, the sacrificial layer 211 of the present invention provides protection for the oxide material within the gaps 209. Since the sacrificial layer 211 has an etch rate that is about the same as the patterned hard mask layer 207, once the hard mask is reached (e.g., FIG. 4) etching and removal of the differing materials (hard mask and sacrificial layer) occur at about the same rate. Thus when the hard mask layer is removed entirely, the oxide material 203 in the gaps 209 is still covered and protected from the dry etch (see, e.g. FIG. 5). Consequently, even if the dry etch is continued to remove the remaining sacrificial material 211 in the gaps 209, an amount of time at which the oxide 203 is exposed to the dry etch is dramatically reduced because the dry etch is timed to end as soon as the sacrificial material 211 is removed fully. Thus oxide gouging is dramatically reduced as compared with prior art hard mask removal processes. Further, since the dry etch is substantially selective with respect to silicon, once the hard mask is removed, a subsequent removal of the remaining sacrificial layer in the gaps 209 may proceed without a substantial impact on the silicon layer.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A method of stripping a hard mask from a substrate comprising an insulating material exposed within gaps patterned through the hard mask, comprising:

coating the substrate with a sacrificial material that fills the gaps; and plasma etching to strip the sacrificial material and the hard mask substantially completely from the gaps in a single plasma etch process.

2. The method of claim 1, wherein the insulating material comprises an oxide.

3. The method of claim 1, wherein the insulating material comprises a material selected from the group consisting of silicon oxide, TEOS and HDP.

4. A method of stripping a hard mask from a substrate comprising an insulating material exposed within gaps patterned through the hard mask, comprising:

coating the substrate with a sacrificial material that fills the gaps; and plasma etching to strip the sacrificial material and the hard mask substantially completely from the gaps in a single plasma etch process;

wherein the hard mask is employed to etch a layer or bulk portion of the substrate comprising silicon.

5. The method of claim 4, wherein the hard mask material comprises a nitride.

6. The method of claim 5, wherein the hard mask material comprises SiN or SiON.

7. The method of claim 4, wherein the insulating material comprises an oxide.

8. The method of claim 4, wherein the sacrificial material comprises a material selected from the group consisting of resists and organic BARC materials.

9. The method of claim 4, wherein plasma etching completely removes the sacrificial material from the gaps.

10. The method of claim 4, wherein the sacrificial material is spin-coated onto the substrate.

11. A method of removing a hard mask from a silicon containing surface, comprising:

providing a sacrificial material that covers the hard mask and fills gaps in the surface patterned with the hard mask; and plasma etching to remove substantially completely the hard mask and that portion of the sacrificial material that covers the hard mask in a single plasma etch process wherein plasma etching completely removes the sacriticial material from the gaps.

12. The method of claim 11, wherein the hard mask material comprises a nitride.

13. The method of claim 12, wherein the hard mask material comprises SiN or SiON.

14. The method of claim 11, wherein the sacrificial material comprises a material selected from the group consisting of resists and organic BARC materials.

15. The method of claim 11, wherein the plasma etching is carried out with gases comprising a fluorinated hydrocarbon and oxygen.

16. The method of claim 11, wherein the sacrificial material is spin-coated onto the substrate.

17. The method of claim 11, wherein the hard mask is employed to etch a silicon wafer.

18. The method of claim 11, wherein the hard mask is employed to etch a polysilicon or amorphous silicon layer.

19. The method of claim 11, wherein the sacrificial material protects an oxide within the gaps through at least a portion of the plasma etching.

20. A method of removing a hard mask from the gap, comprising:

forming an oxide region over a semiconductor substrate;

forming a silicon layer over the semiconductor substrate, wherein the silicon layer covers the oxide region.

21. The method of claim 20, wherein the sacrificial layer comprises a BARC layer or a photoresist layer.

22. The method of claim 20, wherein forming the sacrificial layer comprises:

spinning coating the sacrificial layer over the semiconductor substrate; and baking the sacrificial layer, thereby substantially planarizing the sacrificial layer.

23. A method of removing a hard mask comprising:

forming an oxide region over or within a semiconductor substrate;

forming a silicon layer over the semiconductor substrate, wherein the silicon layer covers the oxide region;

forming and patterning a hard mask layer over the silicon layer;

etching a gap in the silicon layer to expose a portion of the oxide region using the patterned hard mask as an etch mask;

forming a sacrificial layer having a relatively planar top surface over the semiconductor substrate, the sacrificial layer comprising a portion covering the hard mask layer and a portion filling the gap; and removing substantially completely the sacrificial layer and the hard mask layer from the gap with a single plasma etch process, wherein an etch rate of the sacrificial layer and an etch rate layer of the hard mask layer are selected to substantially completely remove the portion of the sacrificial layer covering the hard mask and the hard mask layer, and wherein the etch rate of the hard mask layer is substantially greater than the silicon layer.

* * * * *